US008471564B2

(12) United States Patent
Zimmermann et al.

(10) Patent No.: US 8,471,564 B2
(45) Date of Patent: Jun. 25, 2013

(54) SYSTEM AND METHOD FOR RECORDING THE CHARACTERISTIC CURVES OF LIGHT-EMITTING DIODES (LEDS)

(75) Inventors: Michael Zimmermann, Heiligkreuz (CH); Eduardo Pereira, Siebnen (CH)

(73) Assignee: TridonicAtco Schweiz AG, Ennenda (CH)

( * ) Notice: Subject to any disclaimer, the term of this patent is extended or adjusted under 35 U.S.C. 154(b) by 543 days.

(21) Appl. No.: 12/665,117

(22) PCT Filed: Jun. 20, 2008

(86) PCT No.: PCT/EP2008/005002
§ 371 (c)(1),
(2), (4) Date: May 13, 2010

(87) PCT Pub. No.: WO2009/000475
PCT Pub. Date: Dec. 31, 2008

(65) Prior Publication Data
US 2012/0139544 A1     Jun. 7, 2012

(30) Foreign Application Priority Data
Jun. 25, 2007   (DE) .................. 10 2007 029 123

(51) Int. Cl.
*G01R 31/00*   (2006.01)
(52) U.S. Cl.
USPC ........................................................ 324/414
(58) Field of Classification Search
None
See application file for complete search history.

(56) References Cited

U.S. PATENT DOCUMENTS

| | | | | |
|---|---|---|---|---|
| 8,129,914 B2* | 3/2012 | Zimmermann | | 315/224 |
| 2005/0062481 A1* | 3/2005 | Vaughn et al. | | 324/500 |
| 2005/0218836 A1* | 10/2005 | Tobler et al. | | 315/291 |
| 2010/0148683 A1* | 6/2010 | Zimmermann et al. | | 315/224 |

FOREIGN PATENT DOCUMENTS

| | | |
|---|---|---|
| DE | 202004006292 | 7/2004 |
| WO | WO2006043232 | 4/2006 |
| WO | WO2008120143 | 10/2008 |

OTHER PUBLICATIONS

EIA/JESD51-1 Integrated Circuits Thermal Measurement Method—Electrical Test Method (Single Semiconductor Device), Electronic Industries Association; Dec. 1995, Electronic Industries Alliance, Arlington, VA, USA.
Lestina TG et al; An Inverse Method to Determine the Temperature Profile on a Semiconductor Power Diode; IEEE Transactions on Components, Hybrids and Manufacturing Technology, IEEE Inc.; New York, US; vol. 11, No. 4; Dec. 1, 1998; pp. 493-498.

* cited by examiner

*Primary Examiner* — Jermele M Hollington
(74) *Attorney, Agent, or Firm* — Fish & Associates, PC

(57) ABSTRACT

The invention relates to a system for recording characteristic curves for a light-emitting diode arrangement (1) comprising at least one light-emitting diode (2). A control unit (4) is used to operate the light-emitting diode arrangement (1) and to record the diode current (8) and the voltage (9) on the light-emitting diode arrangement (1). The control unit (4) is also used to record a first current/voltage pair (P1) and a different second current/voltage pair (P2), at a first temperature of the light-emitting diode arrangement (1), and a third current/voltage pair (P3) and a different fourth current/voltage pair (P4), at a second temperature of the light-emitting diode arrangement (1). The invention also relates to a method for recording characteristic curves of a light-emitting diode arrangement.

17 Claims, 7 Drawing Sheets

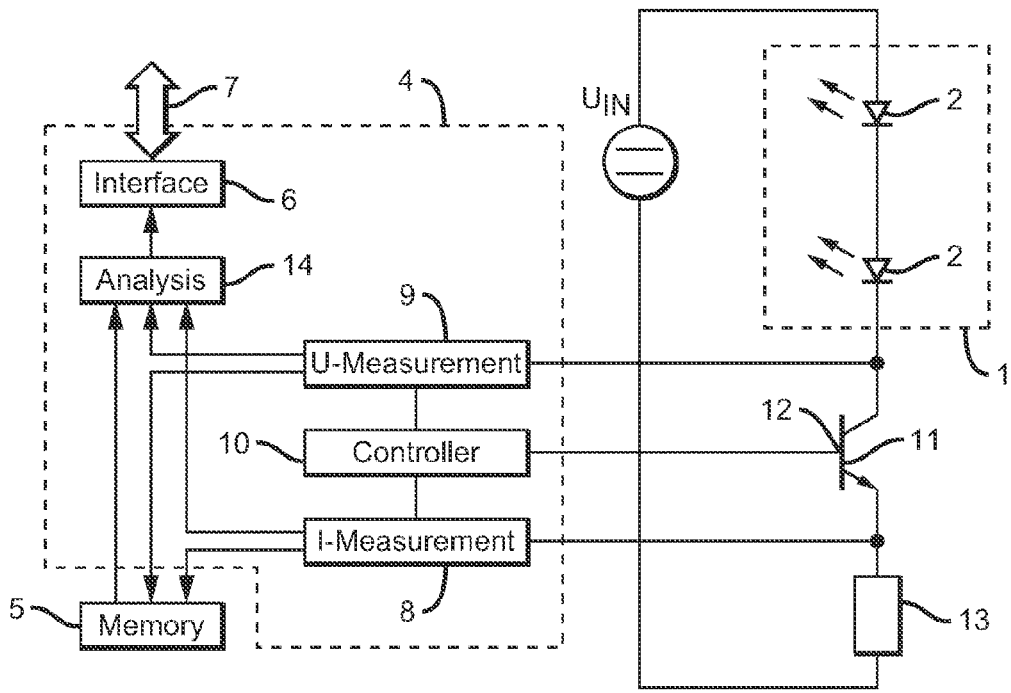
FIG. 1
FIG. 2
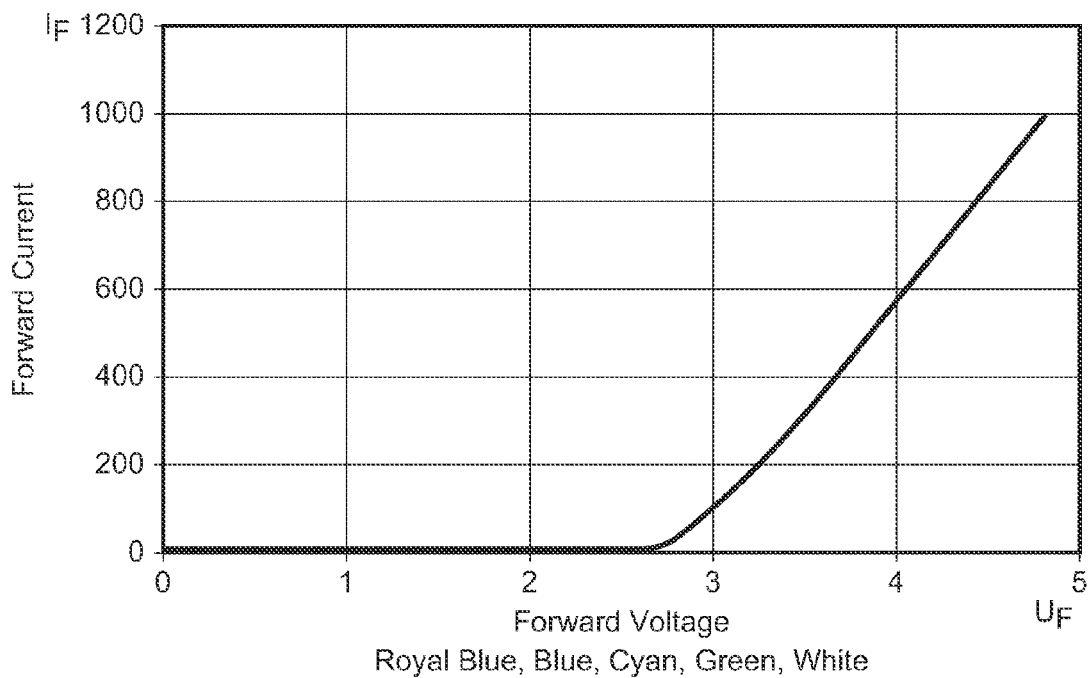
Royal Blue, Blue, Cyan, Green, White

US 8,471,564 B2

SYSTEM AND METHOD FOR RECORDING THE CHARACTERISTIC CURVES OF LIGHT-EMITTING DIODES (LEDS)

BACKGROUND OF THE INVENTION

The invention relates generally to the field of light-emitting diodes (LEDs) and in particular to the field of recording characteristic curves of a light-emitting diode arrangement.

Light-emitting diodes (LEDs) have the advantage of a long service life, for which reason they are used in different domains. For example, they are often used for emergency lights which are switched on automatically if a mains supply for other lighting means, such as e.g. gas discharge lamps, fails.

During the operation of a light-emitting diode, both the light-emitting diode and also the associated circuit are heated by the operation. As a consequence, the service life of the individual components can be reduced or the light-emitting diode or other components can possibly become overloaded. Therefore, the behaviour with respect to time of the light-emitting diodes in operation in terms of temperature behaviour, current behaviour and voltage behaviour is of great interest.

The circuit for operating and controlling the light-emitting diodes must be formed differently depending upon the type of light-emitting diode and must provide different current/voltage values. Therefore, in order to avoid any damage to the light-emitting diode or to the circuit, it is necessary to know precisely the characteristics of the light-emitting diode arrangement being operated.

Therefore, it is the object of the invention to provide a technology which permits convenient operation of light-emitting diode arrangements.

SUMMARY OF THE INVENTION

This object is achieved by the features of the independent claims. The dependent claims develop the central idea of the invention in a particularly advantageous manner.

In one embodiment, the invention proposes a system for operating a light-emitting diode arrangement which comprises at least one light-emitting diode, comprising:

- recording means for the current through the light-emitting diode arrangement and the voltage drop across the light-emitting diode arrangement,
- means for determining the number and/or colour of the light-emitting diodes of the light-emitting diode arrangement using information from the recording means. This can be accomplished in particular with reference to the dynamic resistance of the light-emitting diode arrangement and/or the temperature-dependency of the U/I characteristic curve of the light-emitting diode arrangement. For this purpose, recording means can be provided which output a value which reflects the temperature of the light-emitting diodes.

In accordance with a further aspect of the invention, there is provided a system for recording the characteristic curves for a light-emitting diode arrangement which comprises at least one light-emitting diode, wherein a control unit is designed to operate the light-emitting diode arrangement and to record the diode current through and the voltage across the light-emitting diode arrangement, and wherein the control unit is designed to record a first current/voltage pair and a different second current/voltage pair at a first temperature of the light-emitting diode arrangement, and then to record a third current/voltage pair and a different fourth current/voltage pair at at least a second temperature of the light-emitting diode arrangement.

The system can be designed to measure the first and second current/voltage pairs and the third and fourth current/voltage pairs in each case directly one after the other.

The system can be designed to record further current/voltage pairs at further temperatures of the light-emitting diode arrangement.

The system can be designed to measure the first and second current/voltage pairs immediately after initial operation of the light-emitting diode arrangement, so that the first temperature corresponds to the ambient temperature of the light-emitting diode arrangement.

The system can be designed, in the case of a known temperature coefficient γ to calculate the current temperature $T_J$ of the light-emitting (optically active) layer ("junction") from the voltage values $V_{F2}$ and $V_{F1}$ measured at the same current flow and different temperatures, from $$T_J = 1/\gamma(V_{F2} - V_{F1} + \gamma T_U),$$

where $T_U$ is the ambient temperature.

Preferably, a temperature sensor is provided for the purpose of recording the temperature of the light-emitting diode arrangement.

Furthermore, the system can be designed to calculate the temperature coefficient γ from the difference between two flow voltage values $V_{F20}$ and $V_{F10}$ determined for different temperatures, and from the measured temperature values $T_1$ and $T_2$, from $$\gamma = \frac{V_{F20} - V_{F10}}{T_2 - T_1}\left(\frac{mV}{K}\right).$$

Preferably, the system can be designed to determine the number n of light-emitting diodes connected in series in the light-emitting diode arrangement from the determined voltage difference $\Delta U_{F0}$ between two flow voltage values determined for different temperatures, and from the temperature change $\Delta\theta$ in the case of a known temperature coefficient γ, as will be exemplified by the following equation:

$$\Delta\theta = \frac{\Delta U_{F0}}{n \cdot \gamma}.$$

A further aspect of the invention relates to a method for recording the characteristic curves of a light-emitting diode arrangement, wherein a control unit is designed to operate the light-emitting diode arrangement and to record the diode current and the voltage at the light-emitting diode arrangement, comprising the steps of: recording a first current/voltage pair and a different second current/voltage pair at a first temperature, and recording a third current/voltage pair and a different fourth current/voltage pair at least a second temperature.

A further aspect of the invention relates to a method for recording the characteristic curves of a light-emitting diode arrangement, wherein a control unit is designed to operate the light-emitting diode arrangement and to record the diode current and the voltage at the light-emitting diode arrangement, comprising the steps of: initially operating the light-emitting diode arrangement, recording a first current/voltage pair and a different second current/voltage pair at ambient temperature immediately after initial operation, operating the light-emitting diode arrangement over a predetermined time period, and recording a third current/voltage pair and a different fourth current/voltage pair at a second temperature.

BRIEF DESCRIPTION OF THE DRAWINGS

Further features, aspects and advantages of the invention will now be explained with reference to the Figures of the accompanying drawings and the enclosed Figures of the drawings, in which FIG. 1 shows schematically a circuit for operating and for monitoring a light-emitting diode arrangement, FIG. 2 shows an example of a characteristic curve of a light-emitting diode.

DESCRIPTION OF THE PREFERRED EMBODIMENTS

Figure 3:
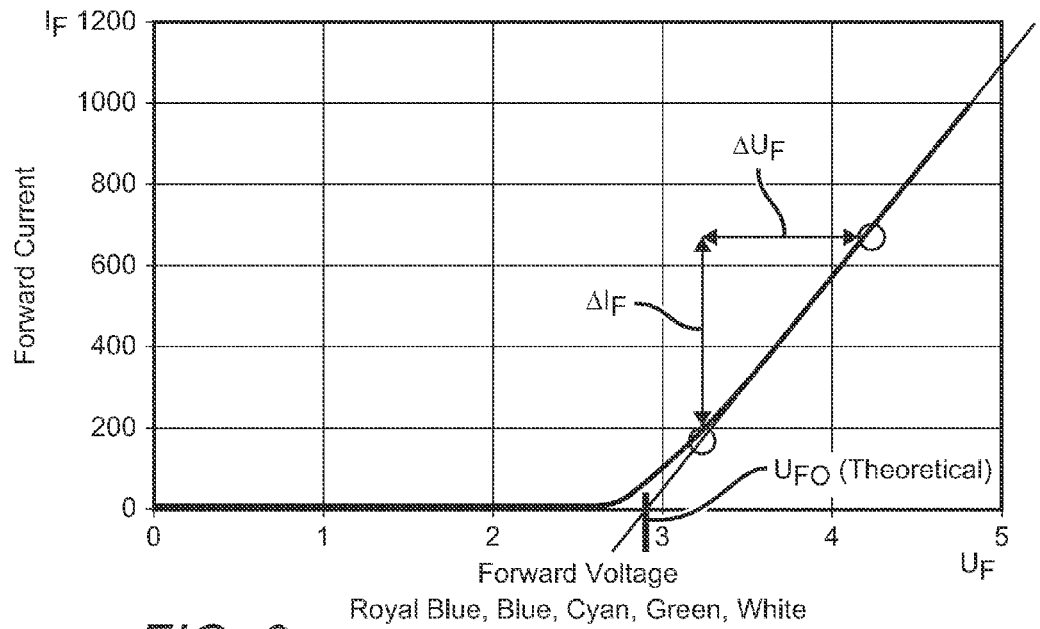
FIG. 3 shows the basic principles for calculating the progression of a characteristic curve of a light-emitting diode.

FIG. 1 illustrates a light-emitting diode 1 which in the exemplified embodiment comprises several light-emitting diodes 2 which are connected in series.

A control unit 4 controls and/or regulates the current through and the voltage across the light-emitting diode arrangement 1. Preferably, the control unit 4 performs a constant power operation or a constant current operation. For this purpose, it is preferably provided that the control unit 4 records the actual current 8 by means of a measuring resistor 13 and optionally also the actual voltage 9 of the light-emitting diode arrangement 1 and evaluates same by means of a regulator 10, to which preferably an internal or external desired value is supplied.

The regulator 10 then outputs a control variable for the current and/or power regulation. In the example of FIG. 1, the regulator 10 controls the control input 12 of a linear regulator 11 which is implemented as a transistor and which on the lower-potential side is connected in series with the diode section. In the meantime, other control variables can also be used, such as e.g. pulse width modulation.

The control unit 4 can be functionally connected to an internal or external memory, in which at least one set of measured current and voltage values can be stored and read-out for subsequent comparison with the corresponding up-to-date values.

The control unit 4 can also comprise an interface 6 for connection to an external data line 7. The data line which can be a bus line 7 can be used for the purpose of supplying desired values for the power and/or the current of the light-emitting diode arrangement 1 e.g. from a control centre.

However, it is also possible to use this external data line 7 to supply commands, by means of which the implementation of error verification by the control unit 4 can be instructed and/or the result of such a verification can be queried.

In essence, the control unit 4 can be designed to perform the error verification continuously, at time intervals and/or in a manner instigated by external commands The result of the error verification can then be shown, reported or signalled.

The time progression can be performed by an evaluation unit 14 by comparing up-to-date values with e.g. stored values from the past. Alternatively, further data, e.g. the time derivative of the respective parameter, can be determined.

The present invention is not limited to a light-emitting diode arrangement 1 consisting of two light-emitting diodes 2 connected in series. On the contrary, the light-emitting diode arrangement 1 in accordance with the present invention can include one or several light-emitting diodes 2 connected in series, alternatively also several parallel-connected light-emitting diodes 2 or even several parallel-connected light-emitting diode structures, wherein each structure can include, in turn, one or several light-emitting diodes 2 connected in series.

Accordingly, in order to measure the various light-emitting diode structures or the various parallel-connected and/or series-connected light-emitting diodes 2 or light-emitting diode arrangements 1, several units can be provided for recording the actual current 8 or the actual voltage 9. Accordingly, the circuit can also include one or several switches, in order to be able to control selectively specific light-emitting diodes or light-emitting diode structures.

The control unit 4 is also designed to control the light-emitting diode arrangement 1, individual light-emitting diodes 2 or individual light-emitting diode structures and to operate them in various U/I pairs, i.e. to operate them at various values of current and/or voltage. In particular, the control unit 4 in accordance with the present invention is designed to operate the light-emitting diode arrangement 1, the light-emitting diodes 2 or light-emitting diode structures in at least two operating modes, wherein in the first operating mode the light-emitting diode arrangement is operated with a lower power or a lower current/voltage pair and in the second operating mode the light-emitting diode arrangement 1 is operated with a higher power or with a higher current/voltage pair.

FIG. 2 illustrates an example of a typical characteristic curve progression of a light-emitting diode (LED). The characteristic curve is plotted in this case as a curve within a coordinate system, in which the X-axis represents the forward voltage $U_F$, i.e. the voltage with which the light-emitting diode 2 or the light-emitting diode arrangement 1 is operated, and in which the Y-axis represents the forward current $I_F$, i.e. the current which flows through the light-emitting diode 2 or the light-emitting diode arrangement 1. It is known that the characteristic curve progression of a light-emitting diode appears such that a current flow begins only at a defined flow voltage. Ideally, the resistance of the light-emitting diode in the range greater than the flow voltage would be equal to zero, and the current would rise sharply. In practice, the characteristic curve rises in the range above the flow voltage at a substantially constant gradient.

With reference to FIG. 3, it is schematically explained how the characteristic curve of a light-emitting diode is operated mathematically. As seen in FIGS. 2 and 3, the characteristic curve rises substantially linearly. Only just above the flow current does the actual progression deviate from the linear progression.

In the range of the linear progression of the characteristic curve, a voltage difference $\Delta U_F$ and a current difference $\Delta I_F$ are calculated using two measurement values. The gradient of the lines is then calculated from $$\Delta R = \frac{\Delta U_F}{\Delta I_F}, \tag{1}$$

where $\Delta R$ thus represents the gradient of the U/I characteristic curve above the flow voltage, which is designated hereinafter as the "dynamic resistance".

The flow voltage $U_{F0}$ (which is also designated hereinafter as $V_{F0}$) is determined theoretically by extrapolation of the characteristic curve lines, wherein $U_{F0}$ corresponds to the point of intersection of the extrapolated characteristic curve lines with the X-axis. The characteristic curve progression $U_{FLED}$ can thus be described as follows:

$$U_{FLED} = U_{F0} + \Delta R \cdot I_F \tag{2}.$$

Figure 4:
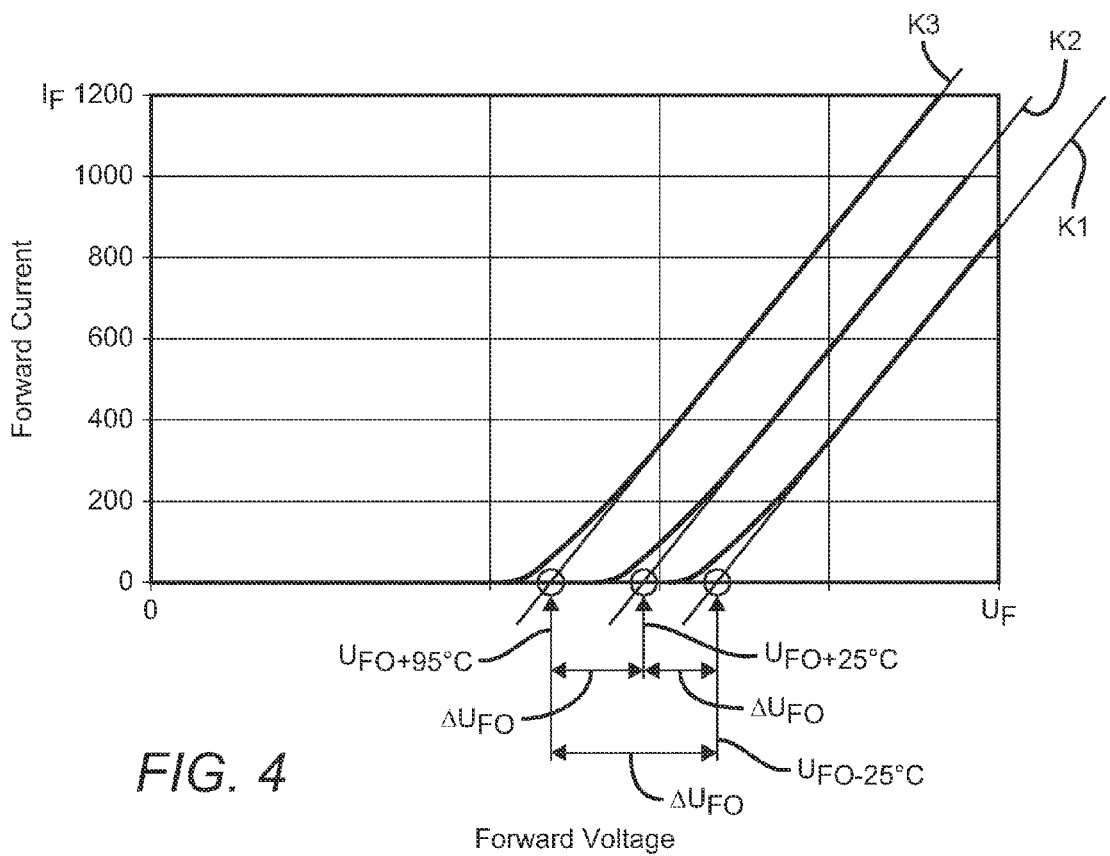
FIG. 4 shows the principle of the temperature-dependent shift of the characteristic curve of a light-emitting diode.

The flow voltage and thus the characteristic curve demonstrate a thermal dependency (drift), wherein a typical value for this is −3 mV/K. This type of temperature drift is illustrated schematically in FIG. 4. More specifically, FIG. 4 illustrates three different characteristic curves of a diode, wherein each characteristic curve corresponds to a different temperature of the diode. The gradient of the characteristic curves K1 to K3 is identical in this case, only the flow voltage $U_{F0}$ varies. In this case, the flow voltage $U_{F0}$ is at its lowest point in the case of the characteristic curve K3 and is at its highest point in the case of the characteristic curve K1. In this case, the characteristic curve K3 corresponds to the highest temperature and the characteristic curve K1 corresponds to the lowest temperature. The change in the flow voltage is denoted hereinafter by the reference $\Delta U_{F0}$.

Figure 5:
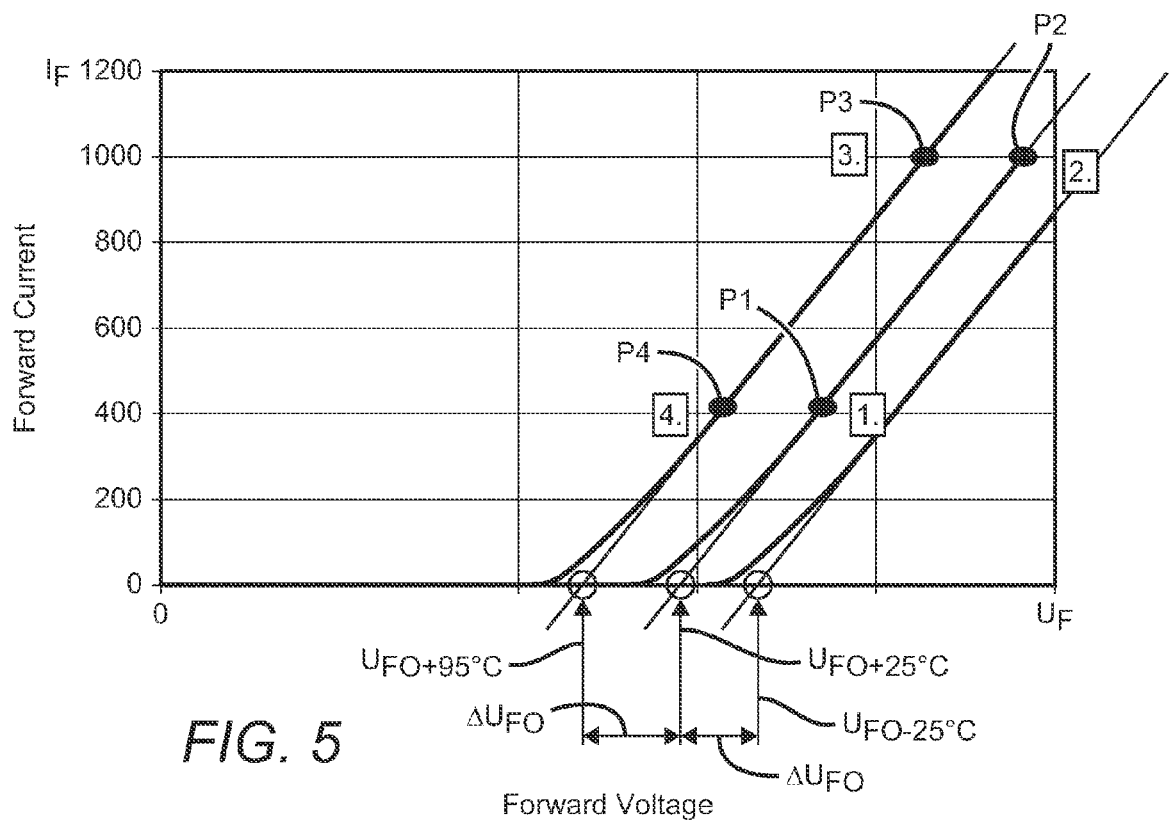
FIG. 5 shows schematically the data which are recorded for determining the characteristic curves in accordance with the present invention.

FIG. 5 schematically illustrates the procedure for determining the characteristic curves of a light-emitting diode 2 or a light-emitting diode arrangement 1 in accordance with the present invention. In accordance with the invention, a four-point measurement is proposed, in which initially a current voltage measurement is performed at low power and thus substantially at ambient temperature and is then performed very quickly at high power. Therefore, the two straight points for the ambient temperature are already known. This is schematically illustrated in FIG. 5, wherein P1 corresponds to the point on the characteristic curve line at ambient temperature which is measured at low power. The point P2 corresponds to the point on the characteristic curve line at ambient temperature which is measured at high power. In accordance with the present invention, it is significant in this case that the measurements of the points P1 and P2 are performed at short time intervals, so that still no significant heating of the light-emitting diode 2 has taken place. By reason of the two measured points P1 and P2 which in each case correspond to a current voltage pair, it is thus possible to determine unequivocally the characteristic curve of the light-emitting diode at ambient temperature.

After these measurements have been conducted, the light-emitting diode is operated for a predetermined time at high power, whereby it heats up. Then, at this higher temperature a current voltage measurement is conducted again at high power and then in turn a measurement is carried out at a very short time interval at low power. Therefore, two measurement points can likewise be recorded for a second characteristic curve at a higher temperature. This is schematically illustrated in FIG. 5, wherein the point P3 corresponds to the measured current voltage pair at high temperature and high power, and the point P4 corresponds to the measured current voltage pair at high temperature and low power.

Instead of recording the first current voltage pair P1 and P2 at ambient temperature, the first pair P1 and P2 can also be recorded at a temperature deviating from the ambient temperature. The only important aspect is that there is a sufficiently large distance between the temperatures of the two characteristic curves, so that a temperature behaviour of the light-emitting diode can be deduced from the recorded characteristic curves. Furthermore, it is preferably provided that the first measurement point P1 and the last measurement point P4 are measured in a first operating mode and the second measurement point P2 and the third measurement point P3 are measured in a second operating mode. This simplifies control, as only two preset operating modes have to be stored and used. However, as an alternative it is also possible to use four different operating modes for measuring the points. The only important aspect is that the points measured in each case within a characteristic curve are measured at sufficiently spaced apart power levels, so as to facilitate plotting of the characteristic curve.

Furthermore, the present invention is not limited to the measurement of merely four current/voltage pairs. On the contrary, it is also possible to record further measurement points at further temperatures, in order to improve the accuracy of the determined characteristic curves and the determined temperature behaviour. Furthermore, it is also possible to record for each temperature more than two measurement points of the characteristic curve lines.

In an advantageous manner, the respective operating temperature is also recorded with the characteristic curves. In a simplified method, the temperature directly after the switch-on of the light-emitting diode can be assumed in this case to be ambient temperature. Since, after a sufficiently long operation of the light-emitting diode at high power, the operating temperature of the chip at nominal operating current is generally known, the temperature can be assumed to be the operating temperature. The possible deviation of the operating temperature by means of an offset caused by a deviating ambient temperature can be disregarded for this general method without any temperature measurement.

In order to determine the characteristic curves and characteristic values in a precise manner, the temperature can also be recorded by means of a sensor. This is particularly advantageous when calibrating the light-emitting diode module, in subsequent methods the temperature measurement can also be dispensed with on account of the determined and stored characteristic curves. For the purpose of the temperature measurement, the light-emitting diode module is equipped with a thermocouple 21 which renders it possible to record the absolute temperature on the module. Ideally, the temperature sensor 21 in this case measures the temperature of the optically active layer ("junction") of the light-emitting diode, in which the temperature-dependent physical processes take place.

The following procedure can be applied: At the beginning of the measurement (LED switch-on) the temperature sensor 21 and also the optically active layer are both at the same temperature (ambient temperature). If the temperature dependency of the forward voltage of the LED is known, then it is possible to deduce the precise temperature of the of the [sic] optically active layer on the basis of the temperature which is measured where appropriate remote from the optically active layer.

Figure 9:
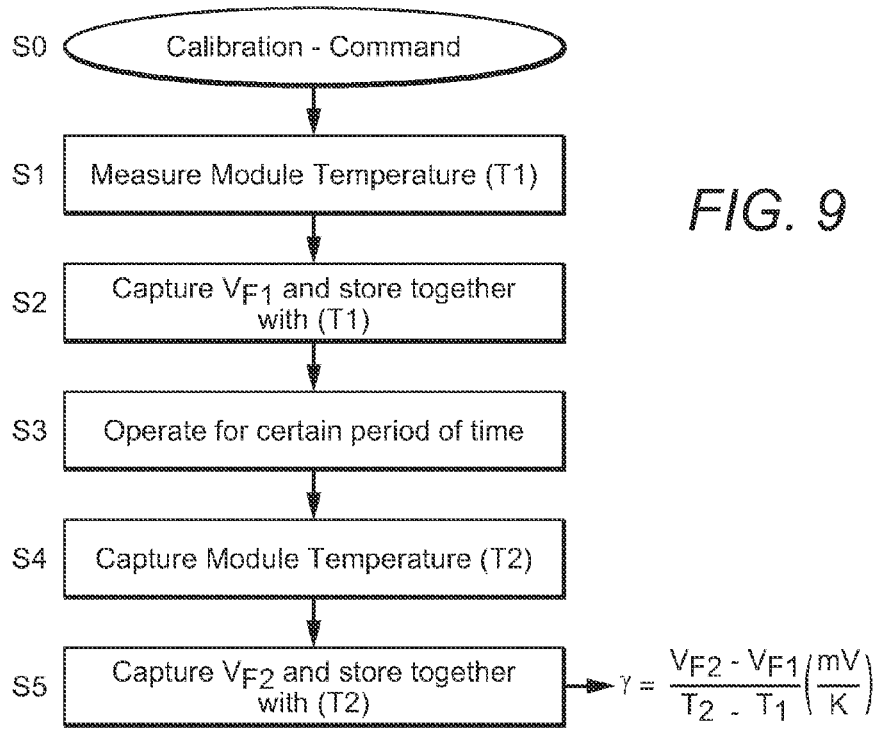
FIG. 9 shows schematically the steps for determining the temperature coefficient in accordance with the present invention.

FIG. 9 schematically illustrates the method for determining the temperature coefficient of the light-emitting diode. In a first step S0, the calibration command is transmitted to the circuit arrangement and is processed by the control unit. The following steps are then performed in each case by the control unit or the light-emitting diode controller. In a next step S1, the temperature $T_1$ of the module is recorded. Subsequently, in step S2 the forward voltage $V_{F1}$ of the light-emitting diode is determined by means of a reference current and this value is allocated to the measured temperature reference value $T_1$ and both values are stored together. In the following step S3, the light-emitting diode is operated over a certain time period. In the following step S4, the temperature $T_2$ which has by now occurred during the working operation is measured. In a next step S5, the current new forward voltage $V_{F2}$ is then determined by means of the reference current used in step S2 and it is stored together with the temperature $T_2$.

The temperature coefficient γ which indicates the temperature drift can then be calculated as $$\gamma = \frac{V_{F2} - V_{F1}}{T_2 - T_1}\left(\frac{mV}{K}\right). \quad (3)$$

Alternatively, after determination of second characteristic curves it is possible by means of extrapolation of the characteristic curve to determine the theoretical flow voltage $V_{F0}$ for each of the characteristic curves, so that the temperature drift is then derived from:

$$\gamma = \frac{V_{F20} - V_{F10}}{T_2 - T_1}\left(\frac{mV}{K}\right), \quad (3a)$$

wherein $V_{F20}$ and $V_{F10}$ are in each case the values for the flow voltage of the determined characteristic curves. The [lacuna] when using the flow voltage resides in the fact that by scaling to the zero point the two current points have to be interpreted less exactly, i.e. although the current flow must be known, it does not have to include the exact same value.

This also applies to all proposed methods, in which two voltage values are determined for different characteristic curves at a specific reference current: alternatively, the characteristic curve line can also be extrapolated, in order to be able to determine the flow voltage and in this way dispense with the exact measurement of a reference current.

However, although the temperature coefficient for each light-emitting diode is provided by the manufacturer, these values can vary for different light-emitting diodes, sizes, colours or even circuit arrangements. The proposed calibration method renders it possible to determine individually and precisely the temperature coefficient in a circuit-related manner and for each light-emitting diode or light-emitting diode arrangement.

The method as shown in FIG. 9 can also be applied such that after a one-time determination of the temperature coefficient γ with following current or voltage measurements, γ can be eliminated as a fixed variable in the formula (3) or (3a) and an error in the light-emitting diode arrangement can thus be deduced by the temperature and voltage. In other words, when γ is known the recognition of an error in the light-emitting diode or light-emitting diode arrangement 1 is thus facilitated.

Figure 10:
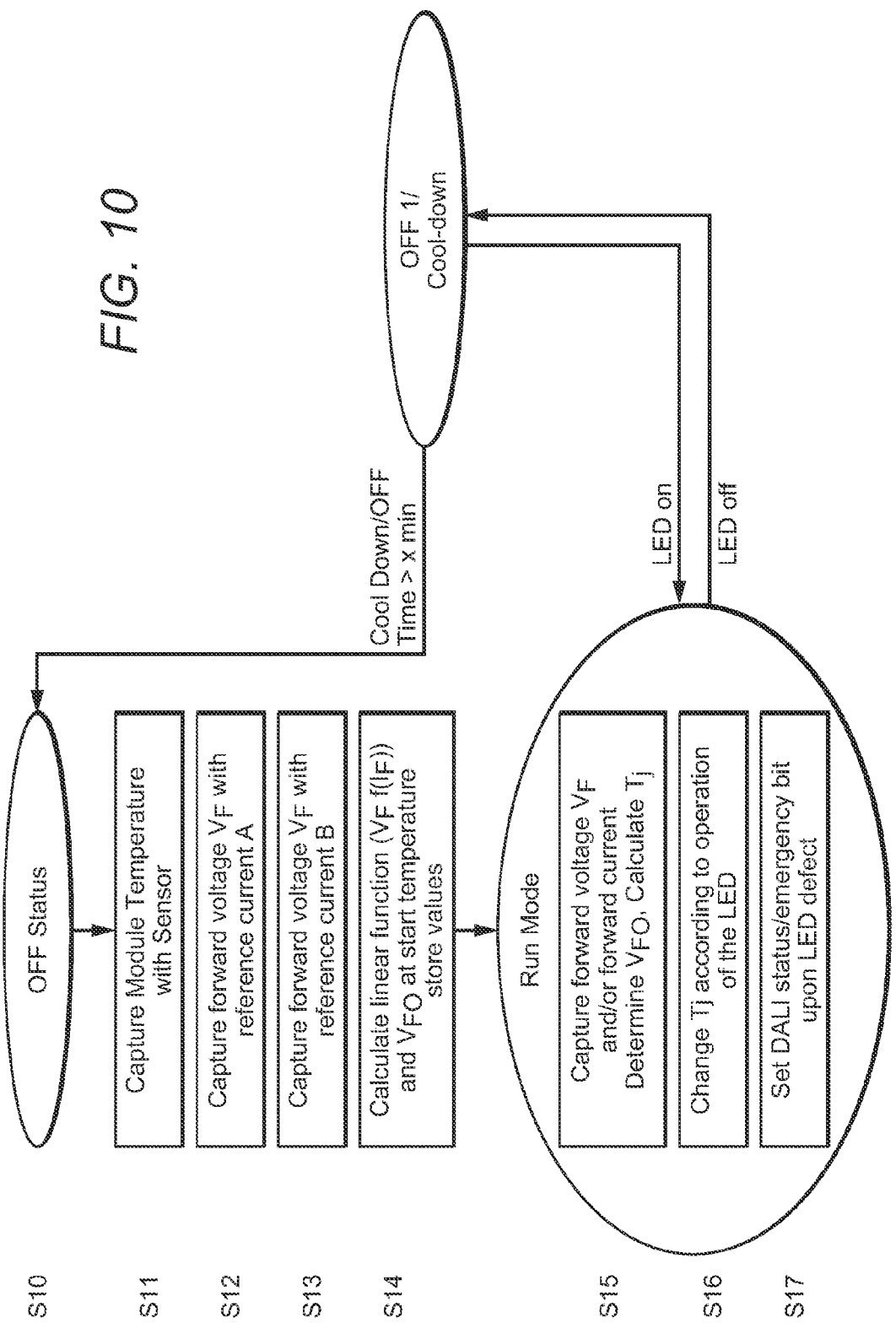
FIG. 10 shows schematically the steps for recording the temperature of the optically active layer in accordance with the present invention.

In a first application of the present invention, after the calibration has been performed by the method of four-point measurement, as stipulated in accordance with the invention, during the continuing operation in each case the temperature of the LED can [lacuna]. The method is based upon the fact that the difference is formed by means of the reference value of the light-emitting diode voltage and the measurements during operation and in accordance with the adjustment of the formula (3) it is possible to deduce the prevailing temperature of the optically active layer ("junction"). This method is illustrated once again in FIG. 10.

In a first step S10, the light-emitting diode is in the switched-off state. Shortly after the diode is switched on, the module temperature is recorded in a step S11 by means of a sensor 21. In the following step S12, the forward voltage $V_F$ is recorded with the reference current A and in the subsequent step S13 the forward voltage $V_F$ is recorded with the reference current B. Then, the characteristic curve line is calculated in step S14, and the flow voltage $V_{F0}$ is calculated at the starting temperature and these characteristic values are stored. Then, during the continuing operation of the light-emitting diode, the forward voltage $V_F$ and/or the forward current are recorded in step S15 and the flow voltage $V_{F0}$ is determined therefrom and then the temperature $T_J$ of the optically active layer is calculated by adjustment of the formula (3) by subtraction. Then, in the following step S16 the temperature $T_J$ of the optically active layer can be changed by means of corresponding control of the light-emitting diode. In the following step S17, further procedures are possible, e.g. a status can be set in accordance with the DALI-standard definition or a so-called emergency bit can be set, if the light-emitting diode is defective.

In the simplest case, after calibration has been performed or in the case of a known temperature coefficient γ, the temperature $T_J$ of the optically active layer can be determined without any temperature measurement from:

$$T_J = 1/\gamma(V_{F2} - V_{F1} + \gamma T_U), \quad (3b)$$

where $T_U$ is the ambient temperature.

As already explained, in the above formula (3b) the respective flow voltage $V_{F10}$ and $V_{F20}$ can alternatively also be determined instead of the voltage values at specific current reference values, and they can then be incorporated into the formula.

Figure 6A:
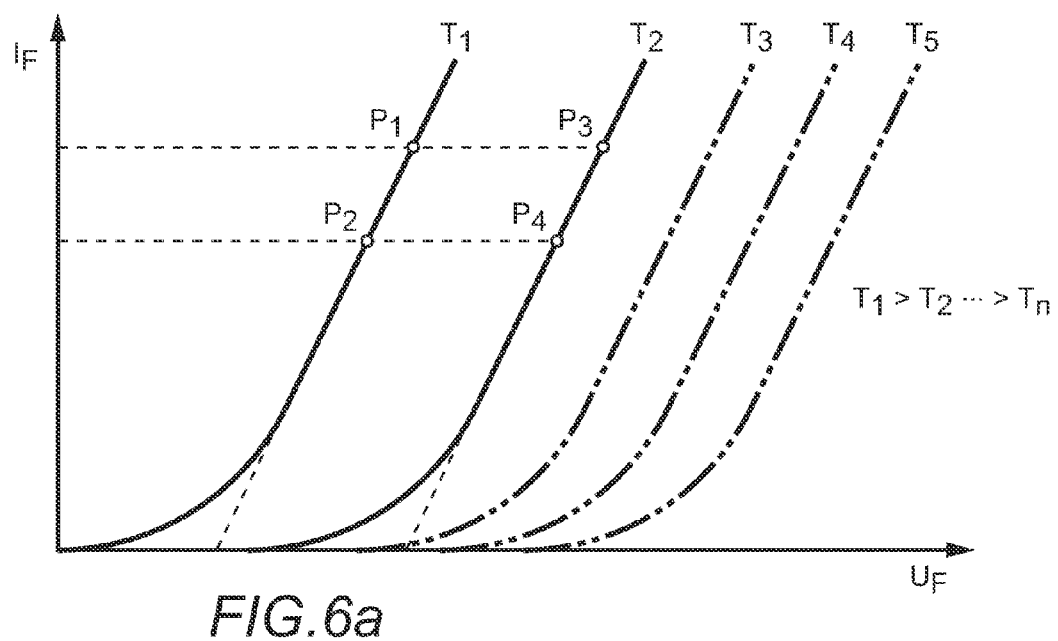
FIG. 6A shows a further example of the temperature behaviour of the characteristic curve of a light-emitting diode.

The advantages of this method are explained hereinafter inter alia with reference to FIGS. 6A and 6B. FIG. 6A illustrates once again different characteristic curves for different temperatures $T_1$ to $T_5$, wherein $T_1$ is greater than $T_2$, etc.

Figure 6B:
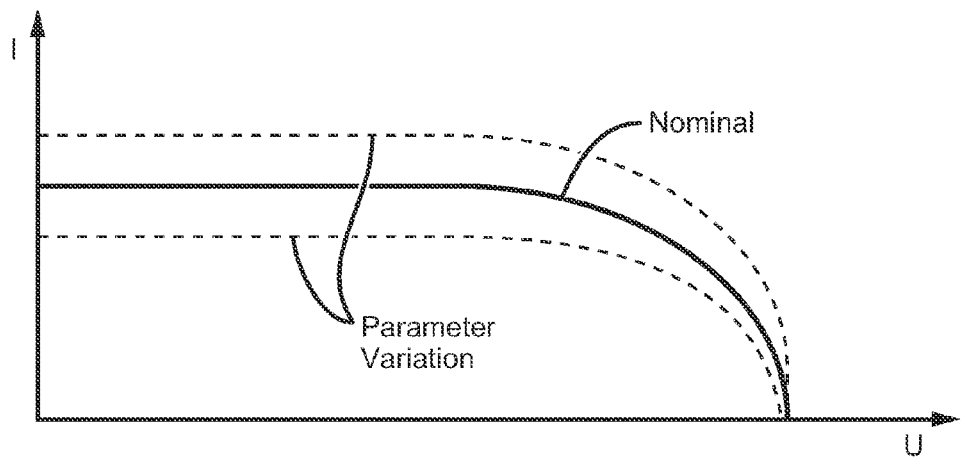
FIG. 6B shows the temperature-dependent behaviour of the characteristic variables of a circuit.

FIG. 6B illustrates the current voltage ratios in the circuit which are likewise temperature-dependent. The deviations from the nominal value are illustrated in FIG. 6B as dashed lines. If the same current flow is used at different temperatures, this can lead to variations within the circuit by reason of the parameter deviations. With the proposed method, since the characteristic curves are known, it is possible to dispense with any feedback of the light-emitting diode power variables, as it is known which current voltage ratios exist at a specified current or a specified voltage. In accordance with the present method, the measurements are thus based merely upon the variables of the light-emitting diode. Any changes in the circuit can thus be bypassed as a source of measurement error.

Therefore, with the present method for determining the temperature of the optically active layer it is possible to identify in a reliable manner the failure of a light-emitting diode particularly in emergency applications. Furthermore, the correction of the light-emitting diode control can be varied on the basis of the temperature which is important since the emitted light output and the spectrum vary with the temperature of the optically active layer. Furthermore, in accordance with the present invention only one thermal sensor 21 is required which depending upon the switch-off time can even be in the control device 4. Furthermore, no or only minimal additional wiring is required, as the temperature of the optically active layer can be determined separately for each channel. The two measuring points also did not require any precise current position, only the effective current value must be known, so that the load line can be calculated.

In accordance with the present invention, it is possible to determine the number of series-connected or parallel-connected light-emitting diodes within a light-emitting diode arrangement 1 and/or to determine also the respectively connected colour groups.

The shift $\Delta U_{F0}$ of the flow voltage is different for each light-emitting diode as it is for each semiconductor. The following equation applies:

$$\Delta \theta = \frac{\Delta U_{F0}}{n \cdot \gamma}. \quad (4)$$

In this case, $\Delta\theta$ is the temperature change, $\gamma$ is the temperature coefficient and n indicates the number of light-emitting diodes in series.

In accordance with the present invention, in order to determine the number of diodes in series the characteristic curve is determined and more extensively evaluated e.g. by means of the four-point measurement. As a consequence, an operating device can perform a load recognition for determining the colour of the connected LED(s).

The colour of the light-emitting diode is deduced from the temperature-dependent shift of the characteristic curve (the gradient of the flux voltage plotted over temperature, which is different for different materials for the light-emitting diode chips). In this case, the temperature coefficient which depends upon the semiconductor material and which produces the steepness of the current voltage characteristic curve is decisive. In dependence upon this characteristic value, the change in the shift of the characteristic curve over the temperature is different for different light-emitting diode chips. The value of the temperature dependency of the characteristic curve can then be used for recognition of the light-emitting diode chip and therefore of the spectrum emitted by the light-emitting diode.

If the change in the flux voltage caused by the temperature change and the temperature change itself are known, i.e. if $\Delta U_{F0}$ and $\Delta\theta$ are known, then the temperature coefficient $\gamma$ can be determined by means of an adjustment of the formula (4). Using measurements at several points and in the knowledge of possible temperature coefficients which are found in corresponding tables for different chips, it is also possible to deduce the number of connected light-emitting diodes, as coefficients which are only meaningful for certain combinations are achieved.

Figure 7:
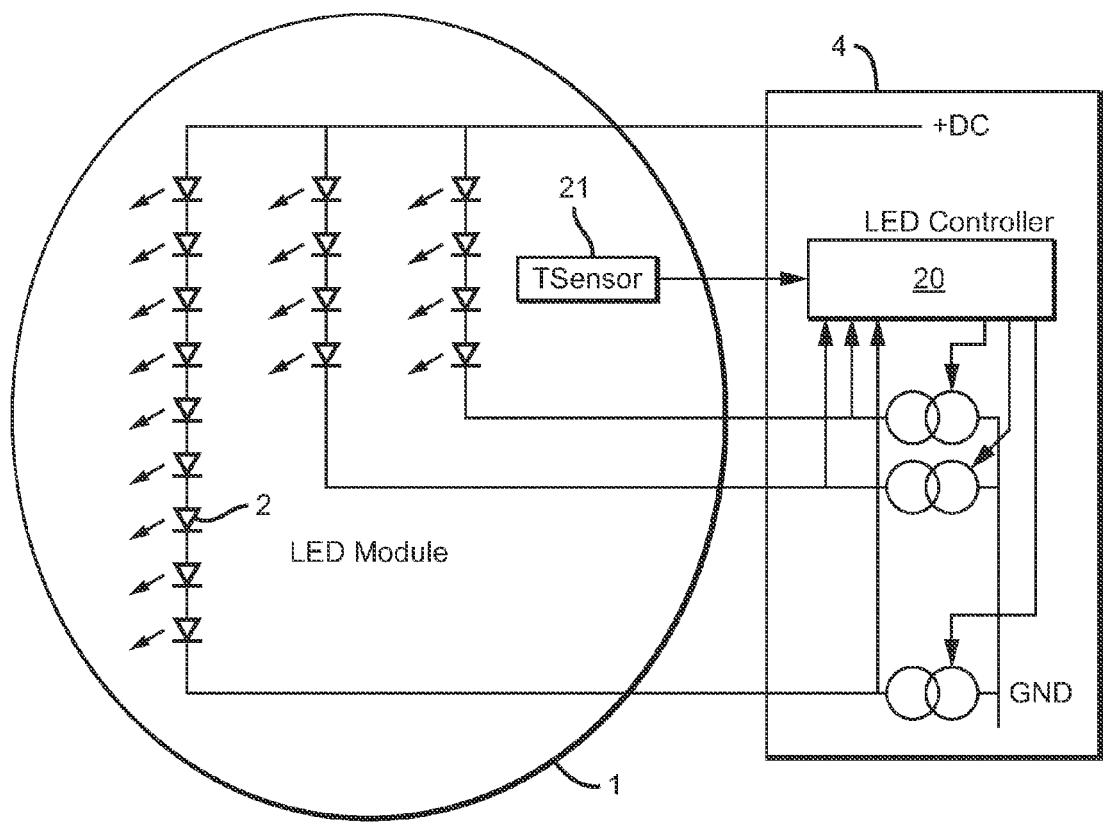
FIG. 7 shows a first example of a circuit for operating a light-emitting diode arrangement in accordance with the present invention.
Figure 8:
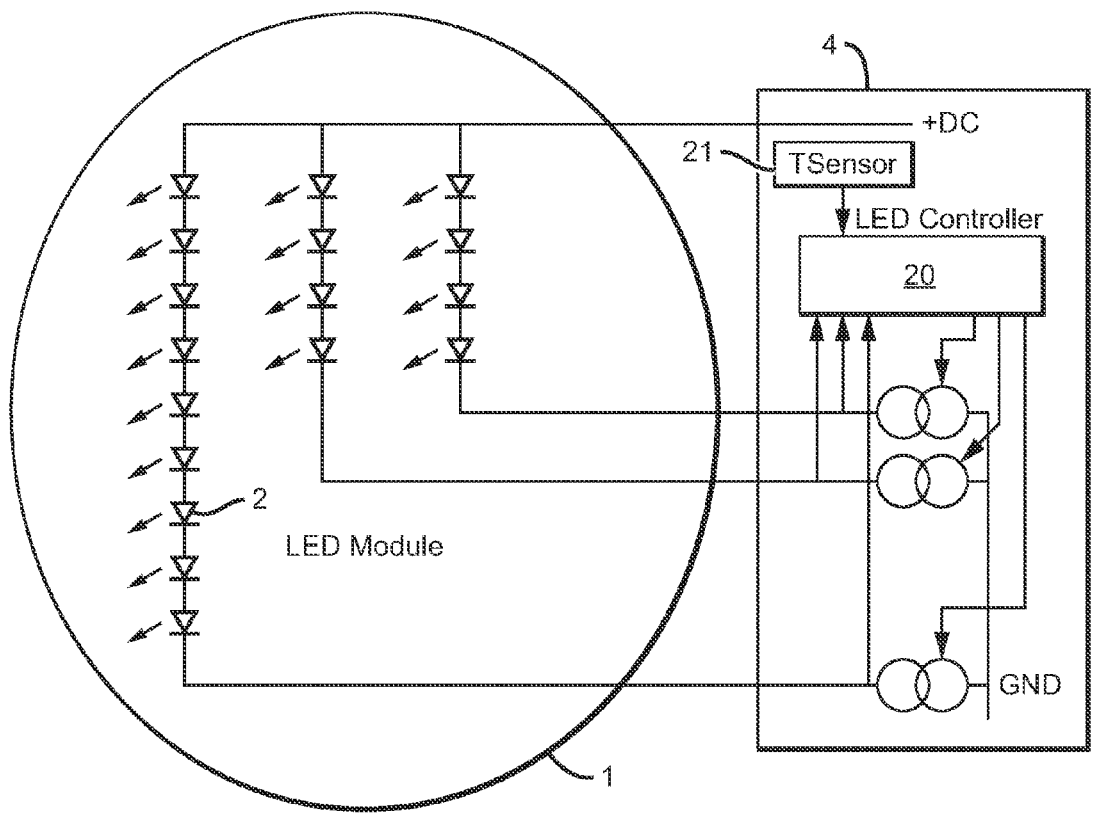
FIG. 8 shows a second exemplified embodiment of a circuit for operating a light-emitting diode arrangement in accordance with the present invention.

FIGS. 7 and 8 illustrate two examples of a corresponding circuit in accordance with the present invention. In this case, a respective light-emitting diode arrangement 1 is illustrated which includes three parallel series of light-emitting diodes. Furthermore, a control unit 4 is provided which includes a voltage source and a central control unit 20. Depending upon requirement, further components 22 are provided which can include a switch, a resistor or other necessary components. In the first circuit as shown in FIG. 7, the temperature sensor 21 is provided inside the light-emitting diode arrangement 1. As an alternative to this, the temperature sensor 21 can be provided inside the control unit 4, as also illustrated in FIG. 8. In this case, the temperature sensor 21 delivers the measured data to the central control unit 20.

In the case of the exemplified embodiment of FIG. 8, the temperature sensor 21 can be contained directly in an integrated circuit of the control circuit 20. Alternatively, it can also be connected directly as a temperature-sensitive device, such as e.g. an NTC-element or diode, to an IC of the control circuit 20 and can be evaluated by the IC of the control circuit 20. This embodiment has the advantage that no additional wiring is required between the control circuit 20 and temperature sensor 21.

However, the embodiment as shown in FIG. 7 has the advantage that the temperature can be monitored directly at the LED module and the construction of the LED light does not have to be taken into consideration.

In accordance with the invention, an operating device for LEDs can determine how many LEDs of which spectrum are connected by reference to temperature measurement values and electric characteristic values (current through the LED arrangement and total voltage drop across all series-connected LEDs in the case of at least two different currents impressed by the control unit), but without a colour sensor the operating device can do this automatically by reference to the above-defined dynamic resistance (see equation (1)) in the case of a known dynamic resistance and known forward voltage of the individual LEDs of different colour.

The entire characteristic curve of the light-emitting diode arrangement is determined by means of at least a two-point measurement and then compared, in the case of which values for the number of light-emitting diodes n,
the forward voltage and the dynamic resistance of which LED type this entire characteristic curve is produced. This determination does not require any recording of temperature.

If a temperature measurement is carried out, it is possible as an alternative or in addition (e.g. to render the above recording plausible) to determine the temperature pendency [sic] of the forward voltage. The number of light-emitting diodes is then derived from the comparison of the temperature dependency of the entire light-emitting diode arrangement with the known value of an individual LED.

The invention exploits the fact that the dynamic ohmic resistance of LED chips can be differentiated more clearly than the absolute value of the flow voltage at constant temperature which overlap on account of the typical tolerances.

In this case, a distinction is made in particular between two colour groups, wherein a first colour group includes the cold colours such as blue, white, green and cyan and a second colour group includes the warm colours such as amber, yellow and red. For the cold colours, e.g. blue, the dynamic resistance can amount to e.g. 1 ohm, whereas for the warm colours such as e.g. red, it can amount to e.g. 2.4 ohms.

The present methodology describes a calibration cycle which determines the total forward voltage per channel, i.e. the forward voltage per series-connected diodes, the temperature per channel, the temperature coefficient per channel and the dynamic resistance $\Delta R$ per channel. Finally, the connected colour or colour group and the light-emitting diodes per channel can be determined reliably by these values. An example of a corresponding calculation is illustrated in FIG.

Figure 11:
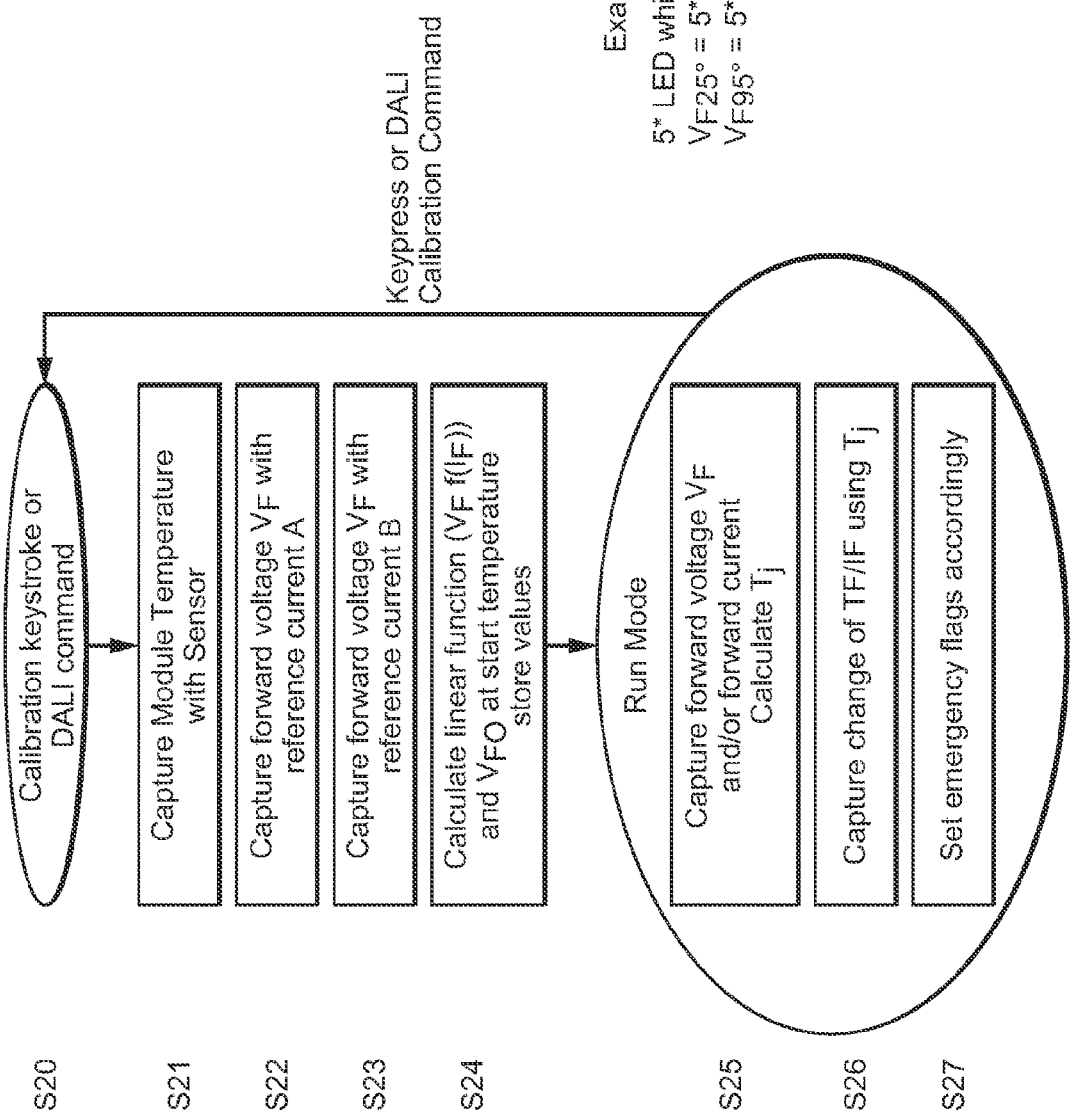
FIG. 11 shows schematically the steps of the method for reliably establishing an LED failure.

11. Furthermore, FIG. 11 illustrates the method steps for reliably recognising an LED failure.

The recording of the number and/or colour or colour group of the connected LEDs can be performed in particular by the control circuit 20 in the operating device. The operating device can also transmit the said information via an interface to a further device, in particular a central processing unit (in a bus system). The central processing unit can then react, e.g. by adapting its control algorithm, to the transmitted information relating to the type and/or number of connected LEDs of each operating device of the system.

This determination can give rise to various advantages in the use of converters and light-emitting diode modules, e.g. in the field of display cabinet illumination. In display cabinets, two colour systems are often used, wherein e.g. white is the main colour and red/amber is the correction colour in one dimension. The automatic determination of the connected colour permits a free selection of the connections for the assembler. Furthermore, it is not important for the controller whether two output stages are now connected to white light-emitting diodes and only one channel is connected to red light-emitting diodes or vice versa. After implementation of the measuring and calibrating method in accordance with the present invention, the software adjusts the control algorithm accordingly. The reason for this is that in such applications, it is in many cases merely a question of shifting the colour coordinate (e.g. in the CIE-system) in colder or warmer directions (e.g. cold white with additional red or orange or both). As an example, cold white can be used in a display cabinet with silver and warm white can be used in a display cabinet with gold. In this case, the controller increases the red proportion on command.

The method in accordance with the invention can also be used in addition in combinations with a colour sensor or even without a colour sensor. Whereas in the combination with a colour sensor the colour sensor can often be useful in the determination of the connected light-emitting diode colour, it would not be required on account of the proposed method. In many applications, this type of sensor can thus be dispensed with on account of the proposed method.

Furthermore, the proposed method thus serves to obviate any complicated initial operation or wiring during assembly. This is particularly important in the case of a sensor or light feedback in separate control units. Standardisation is also simplified.

The invention claimed is:

1. System for operating a light-emitting diode arrangement (1) which comprises at least one light-emitting diode (2), comprising:
   recording means for the current through the light-emitting diode arrangement and the voltage drop across the light-emitting diode arrangement,
   means for determining the number and/or colour of the light-emitting diodes of the light-emitting diode arrangement using information from the recording means, in particular with reference to the dynamic resistance of the light-emitting diode arrangement and/or the temperature-dependency of the U/I characteristic curve of the light-emitting diode arrangement; and
   a temperature sensor (21) for recording a temperature of the light-emitting diode arrangement (1).

2. System as claimed in claim 1, further comprising recording means which determine the temperature of the light-emitting diodes.

3. System as claimed in claim 1 or 2, comprising a control unit (4) which is designed to operate the light-emitting diode arrangement (1) and to record the diode current (8) and the voltage (9) at the light-emitting diode arrangement (1), and to record a first current/voltage pair (P1) and a different second current/voltage pair (P2) at a first temperature of the light-emitting diode arrangement (1),
and
then to record a third current/voltage pair (P3) and a different fourth current/voltage pair (P4) at at least a second temperature of the light-emitting diode arrangement (1).

4. System as claimed in claim 3, wherein the control unit (4) is designed to measure the first and second current/voltage pairs and the third and fourth current/voltage pairs in each case directly one after the other.

5. System as claimed in claim 4, wherein the control unit (4) is designed to record further current/voltage pairs at further temperatures of the light-emitting diode arrangement (1).

6. System as claimed in any one of claims 4 to 5, wherein the control unit (4) is designed to measure the first and second current/voltage pairs immediately after initial operation of the light-emitting diode arrangement, so that the first temperature corresponds to the ambient temperature of the light-emitting diode arrangement (1).

7. System as claimed in claim 6, wherein the control unit (4) is designed, in the case of a known temperature coefficient γ, to calculate the current temperature $T_J$ of the optically active layer from the voltage values $V_{F2}$ and $V_{F1}$ measured at the same current flow and different temperatures, from $$T_J = 1/\gamma(V_{F2} - V_{F1} + \gamma T_U),$$

where $T_U$ is the ambient temperature.

8. System as claimed in claim 1, wherein the control unit (4) is designed to calculate the temperature coefficient γ from the difference between two flow voltage values $V_{F20}$ and $V_{F10}$ determined for different temperatures and from the measured temperature values $T_1$ and $T_2$, from $$\gamma = \frac{V_{F20} - V_{F10}}{T_2 - T_1}\left(\frac{mV}{K}\right).$$

9. System as claimed in any one of claim 8, wherein the control unit (4) is designed to determine the number n of light-emitting diodes (2) connected in series in the light-emitting diode arrangement (1) from the determined voltage difference $\Delta U_{F0}$ between two flow voltage values determined for different temperatures and from the temperature change $\Delta\theta$ in the case of a known temperature coefficient γ, from $$\Delta\theta = \frac{\Delta U_{F0}}{n \cdot \gamma}.$$

10. Method for determining the number and/or colour of the light-emitting diodes of a light-emitting diode arrangement without any optical measurement, comprising the steps of:
   specifying the dynamic resistance and the forward voltage of light-emitting diodes of different colour,
   recording the current through the light-emitting diode arrangement and the voltage drop across the light-emitting diode arrangement for at least two different currents,
   determining the number and/or colour of the light-emitting diodes of the light-emitting diode arrangement using the recorded information; and providing a temperature sensor (21) for recording the temperature of the light-emitting diode arrangement (1).

11. Method as claimed in claim 10, comprising the steps of:
recording a first current/voltage pair (P1) and a different second current/voltage pair (P2) at a first temperature, and
recording a third current/voltage pair (P3) and a different fourth current/voltage pair (P4) at least a second temperature.

12. Method as claimed in claim 11, comprising measuring the first and second current/voltage pairs and the third and fourth current/voltage pairs in each case directly one after the other.

13. Method as claimed in claim 11 or 12, comprising measuring further current/voltage pairs at further temperatures of the light-emitting diode arrangement (1).

14. Method as claimed in any one of claims 10 to 12, comprising measuring the first and second current/voltage pairs immediately after initial operation of the light-emitting diode arrangement, so that the first temperature corresponds to the ambient temperature of the light-emitting diode arrangement (1).

15. Method as claimed in claim 14, comprising:
calculating, in the case of a known temperature coefficient $\gamma$, the current temperature $T_J$ of the optically active layer from the voltage values $V_{F2}$ and $V_{F1}$ measured at the same current flow and different temperatures, from $$T_J = 1/\gamma(V_{F2} - V_{F1} + \gamma T_U),$$

where $T_U$ is the ambient temperature.

16. Method as claimed in claim 10, comprising: calculating the temperature coefficient $\gamma$ from the difference between two flow voltage values $V_{F20}$ and $V_{F10}$ determined for different temperatures and from the measured temperature values $T_1$ and $T_2$, from $$\gamma = \frac{V_{F20} - V_{F10}}{T_2 - T_1}\left(\frac{mV}{K}\right).$$

17. Method as claimed in any one of claim 16, comprising: determining the number n of light-emitting diodes (2) connected in series in the light-emitting diode arrangement (1) from the determined voltage difference $\Delta U_{F0}$ between two flow voltage values determined for different temperatures and from the temperature change $\Delta\theta$ in the case of a known temperature coefficient $\gamma$, from $$\Delta\theta = \frac{\Delta U_{F0}}{n \cdot \gamma}.$$

* * * * *